(12) United States Patent
Sato

(10) Patent No.: US 10,011,057 B2
(45) Date of Patent: Jul. 3, 2018

(54) IMPRINT APPARATUS, AND METHOD OF MANUFACTURING ARTICLE

(71) Applicant: CANON KABUSHIKI KAISHA, Tokyo (JP)

(72) Inventor: Hiroshi Sato, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 164 days.

(21) Appl. No.: 15/224,911

(22) Filed: Aug. 1, 2016

(65) Prior Publication Data
US 2017/0043511 A1   Feb. 16, 2017

(30) Foreign Application Priority Data

Aug. 10, 2015  (JP) .................. 2015-158495
Jul. 4, 2016  (JP) .................. 2016-132779

(51) Int. Cl.
*B29C 43/58* (2006.01)
*G03F 7/00* (2006.01)
*B29C 43/02* (2006.01)

(52) U.S. Cl.
CPC ............ *B29C 43/58* (2013.01); *G03F 7/0002* (2013.01); *B29C 43/021* (2013.01); *B29C 2043/585* (2013.01); *B29C 2043/5891* (2013.01)

(58) Field of Classification Search
CPC ............ B29C 43/58; B29C 2043/5891; B29C 2043/585; B29C 43/021; G03F 7/0002
See application file for complete search history.

(56) References Cited

U.S. PATENT DOCUMENTS

| 7,815,824 | B2 | 10/2010 | Sreenivasan et al. |
| 8,734,701 | B2 | 5/2014 | Kawakami |
| 2007/0246850 | A1* | 10/2007 | Schumaker ........... B29C 43/003 264/40.1 |
| 2009/0214761 | A1* | 8/2009 | Sreenivasan ........... B82Y 10/00 427/10 |

(Continued)

FOREIGN PATENT DOCUMENTS

| JP | 2011513973 A | 4/2011 |
| JP | 2011114309 A | 6/2011 |

(Continued)

OTHER PUBLICATIONS

International Search Report issued in Intl. Appln. No. PCT/JP2017/002625 dated Mar. 14, 2017.

(Continued)

*Primary Examiner* — Nathan L Van Sell
(74) *Attorney, Agent, or Firm* — Rossi, Kimms & McDowell LLP

(57) ABSTRACT

The present invention provides an imprint apparatus which forms a pattern of an imprint material on a substrate by using a mold, the apparatus comprising an image sensing unit configured to sense an image of the imprint material via the mold, and a control unit configured to, in a state in which the mold and the imprint material are in contact with each other, cause the image sensing unit to sense the image of the imprint material while scanning the image sensing unit and obtain information on forming of the pattern of the imprint material based on the image obtained by the image sensing unit.

15 Claims, 10 Drawing Sheets

(56) References Cited

U.S. PATENT DOCUMENTS

| | | | | |
|---|---|---|---|---|
| 2011/0290136 A1* | 12/2011 | Koga | ............... | B82Y 10/00 |
| | | | | 101/481 |
| 2012/0286443 A1* | 11/2012 | Sato | ............... | G01B 11/27 |
| | | | | 264/40.5 |
| 2014/0083454 A1* | 3/2014 | Wakamatsu | ............ | B29C 33/72 |
| | | | | 134/4 |
| 2014/0153003 A1* | 6/2014 | Miyakawa | ......... | G01B 11/0633 |
| | | | | 356/630 |
| 2015/0076724 A1 | 3/2015 | Sato | | |
| 2017/0023857 A1 | 1/2017 | Sato | | |

FOREIGN PATENT DOCUMENTS

| | | | |
|---|---|---|---|
| JP | 2015018997 A | | 1/2015 |
| JP | 2015056589 A | | 3/2015 |
| JP | 2015233071 A | | 12/2015 |
| JP | 2016201522 A | | 12/2016 |
| WO | WO-2013136921 A1 * | 9/2013 | ........... G03F 7/0002 |

OTHER PUBLICATIONS

Written Opinion issued in Intl. Appln. No. PCT/JP2017/002625 dated Mar. 14, 2017.

\* cited by examiner

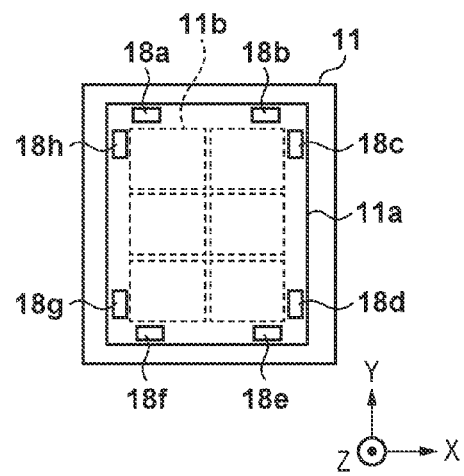
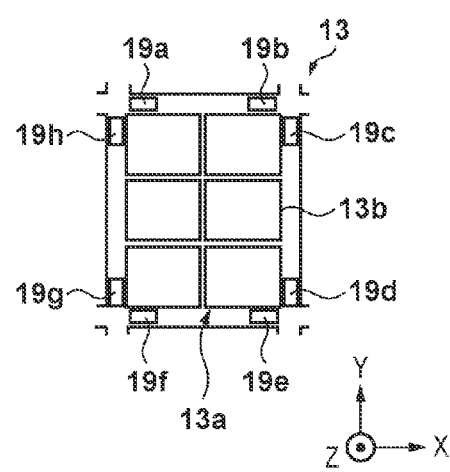
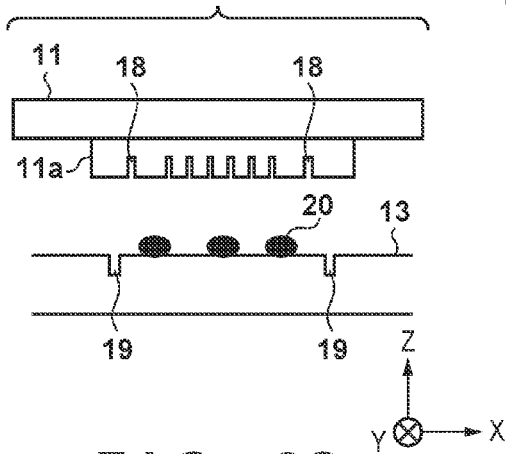
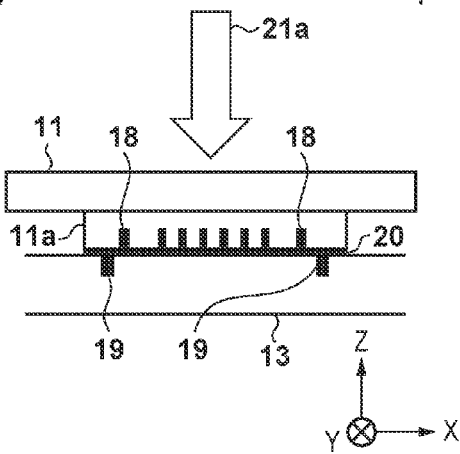
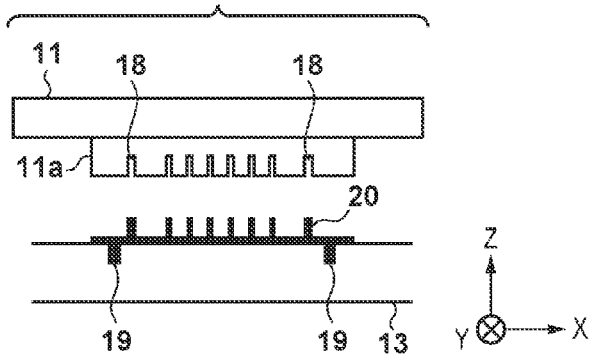

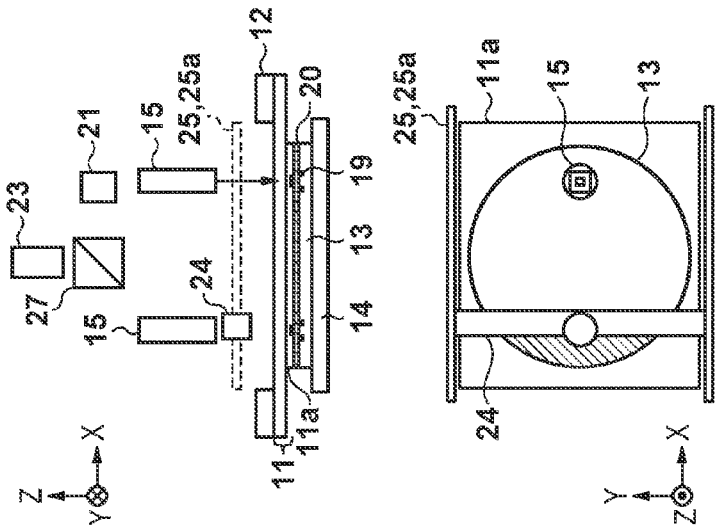
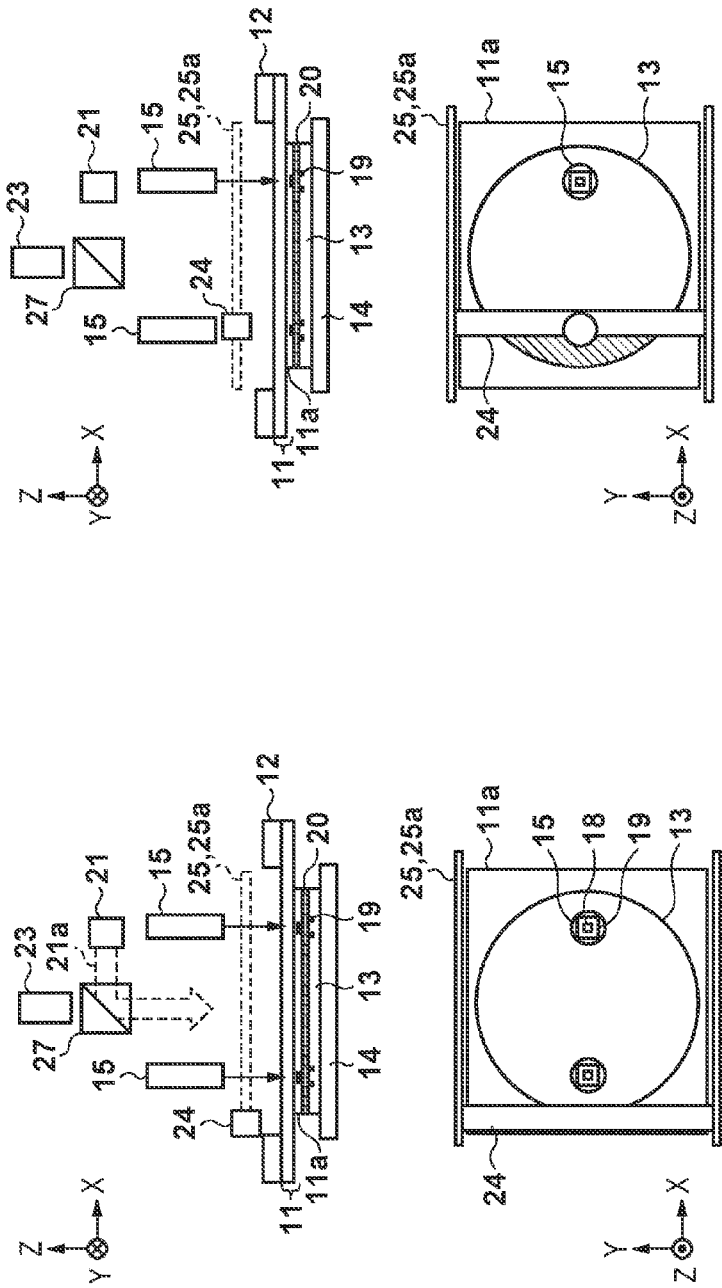

FIG. 12
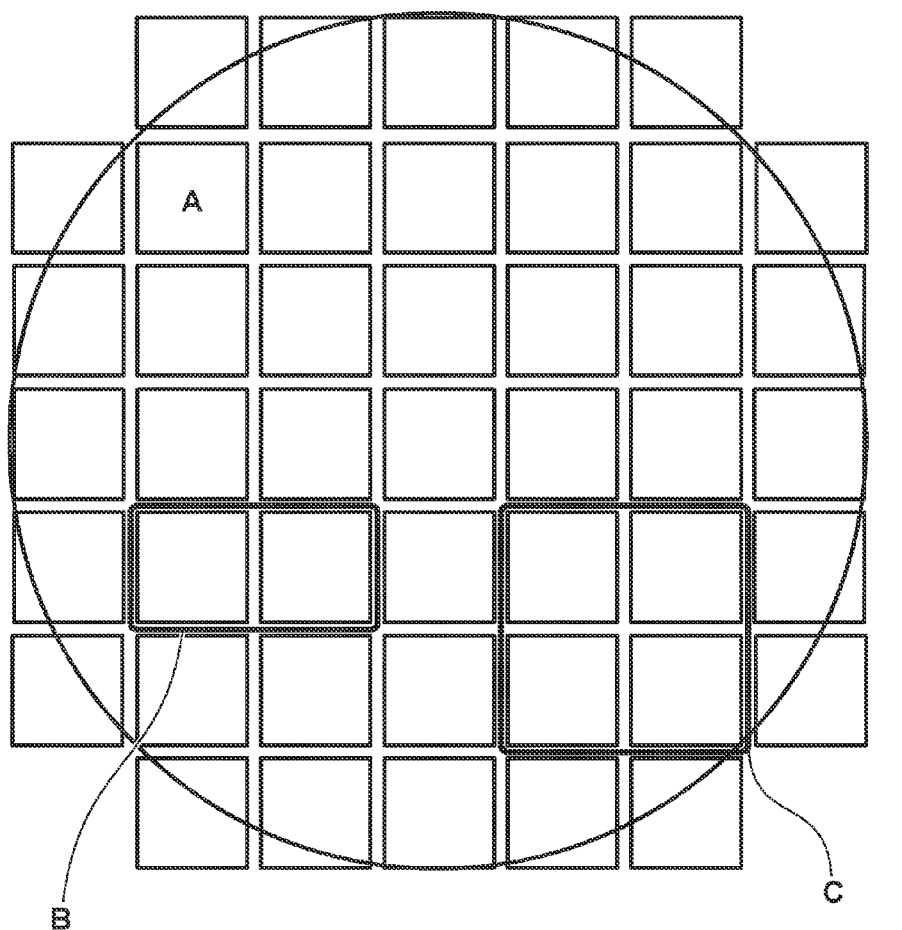
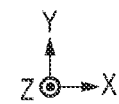

US 10,011,057 B2

IMPRINT APPARATUS, AND METHOD OF MANUFACTURING ARTICLE

BACKGROUND OF THE INVENTION

Field of the Invention

The present invention relates to an imprint apparatus, and a method of manufacturing an article.

Description of the Related Art

An imprint apparatus which forms a pattern of an imprint material on a substrate by using a mold has received attention as one of lithography apparatuses for mass-producing semiconductor devices, magnetic storage media, and the like. The imprint apparatus can form a pattern of the imprint material on the substrate by performing an imprint process of curing the imprint material on the substrate in a state in which the mold and the imprint material are in contact with each other, and separating the mold from the cured imprint material.

In the imprint apparatus, a problem that, in the imprint process, a foreign particle mixes between the mold and the substrate, a pattern of the mold is not sufficiently filled with the imprint material, or the like may arise. In order to detect the problem, U.S. Patent Application Publication No. 2007/0246850 proposes an imprint apparatus which senses an image of an imprint material on a substrate via a mold by using a camera having a field of view within which the entire pattern region of the mold falls.

The camera described in U.S. Patent Application Publication No. 2007/0246850 is configured such that the entire pattern region of the mold falls within the field of view. Accordingly, in the peripheral portion of the pattern region, the image of the imprint material on the substrate in contact with the mold can be sensed obliquely. In this case, the image of the imprint material which fills a plurality of concave portions in a pattern with concave and convex portions of the mold may be sensed in an overlapped state, resulting in an insufficient detection accuracy of the problem in the imprint process.

SUMMARY OF THE INVENTION

The present invention provides a technique, for example, advantageous in detecting a mark on a substrate accurately while suppressing a decrease in throughput.

According to one aspect of the present invention, there is provided an imprint apparatus which forms a pattern of an imprint material on a substrate by using a mold, the apparatus comprising: an image sensing unit configured to sense an image of the imprint material via the mold; and a control unit configured to, in a state in which the mold and the imprint material are in contact with each other, cause the image sensing unit to sense the image of the imprint material while scanning the image sensing unit and obtain information on forming of the pattern of the imprint material based on the image obtained by the image sensing unit.

Further features of the present invention will become apparent from the following description of exemplary embodiments with reference to the attached drawings.

BRIEF DESCRIPTION OF THE DRAWINGS

FIG. 2A is a view showing an example of mold-side marks;

FIG. 2B is a view showing an example of substrate-side marks;

FIG. 3A is a view for explaining an imprint process;
FIG. 3B is a view for explaining the imprint process;
FIG. 3C is a view for explaining the imprint process;
FIG. 6A shows views for explaining image sensing of an imprint material by the image sensing unit;
FIG. 6B shows views for explaining image sensing of the imprint material by the image sensing unit;
FIG. 12 is a view for explaining a region in which a pattern is formed by one imprint process.

DESCRIPTION OF THE EMBODIMENTS

Figure 1:
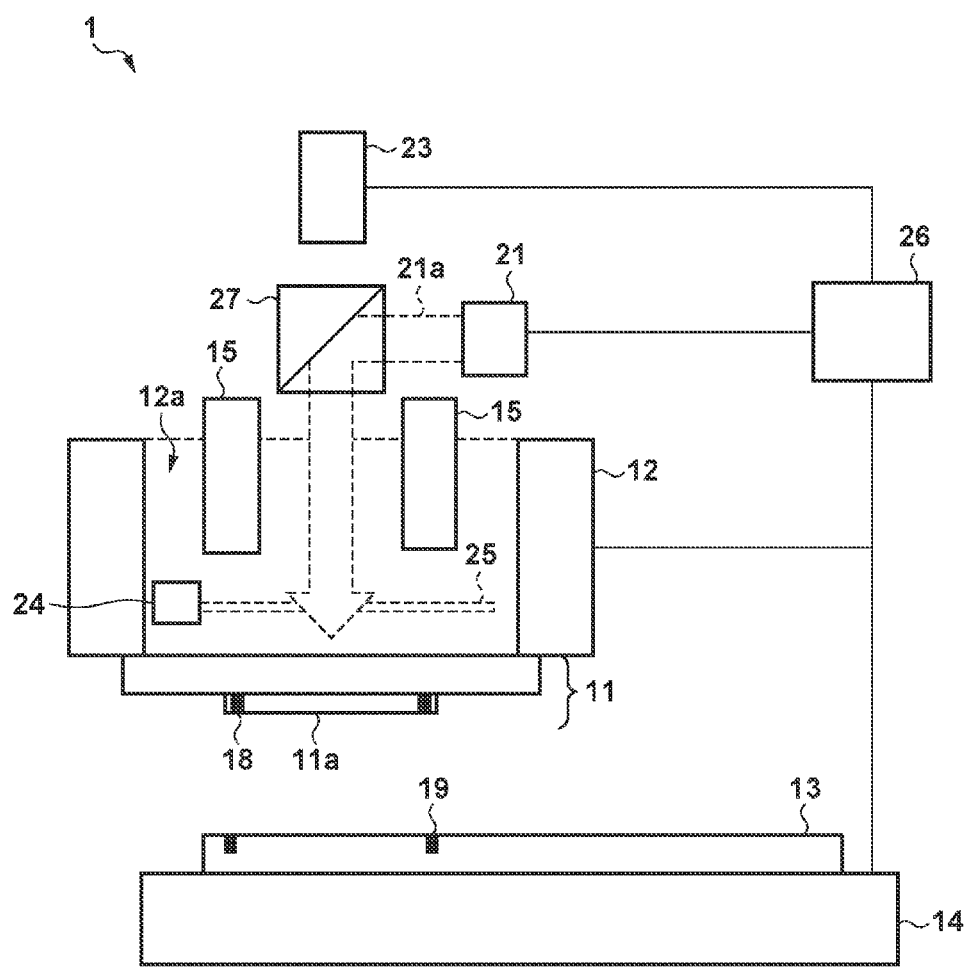
FIG. 1 is a schematic view showing an imprint apparatus according to the first embodiment.

Exemplary embodiments of the present invention will be described below with reference to the accompanying drawings. Note that the same reference numerals denote the same members throughout the drawings, and a repetitive description thereof will not be given.

First Embodiment

An imprint apparatus 1 according to the first embodiment of the present invention will be described. The imprint apparatus 1 is used to manufacture a semiconductor device or the like and performs an imprint process of forming a pattern of an imprint material 20 on a substrate (molding an imprint material 20 on a substrate) by using a mold 11. For example, the imprint apparatus 1 cures the imprint material 20 (resin) on the substrate in a state in which the mold 11 and the imprint material 20 are in contact with each other. Then, the imprint apparatus 1 can form a pattern in the imprint material 20 on the substrate by widening the spacing between the mold 11 and a substrate 13, and separating (releasing) the mold 11 from the cured imprint material 20. A method of curing the imprint material 20 includes a heat cycle method using heat and a photo-curing method using light. In the first embodiment, an example will be described in which the photo-curing method is adopted. The photo-curing method is a method of curing the imprint material 20 by supplying an uncured ultraviolet-curing resin as the imprint material 20 onto the substrate, and irradiating the imprint material 20 with light (ultraviolet light) in a state in which the mold 11 and the imprint material 20 are in contact with each other.

[Apparatus Configuration]

FIG. 1 is a schematic view showing the imprint apparatus 1 according to the first embodiment. The imprint apparatus 1 can include a mold holding unit 12 which holds the mold 11, a substrate holding unit 14 which holds the substrate 13, detection units 15, a curing unit 21, an observation unit 23, an image sensing unit 24, and a control unit 26. The imprint apparatus 1 can also include a supply unit which supplies the imprint material 20 onto the substrate, a bridge plate configured to hold the mold holding unit 12, a base plate configured to hold the substrate holding unit 14, and the like.

The mold 11 is made of a material, such as quartz, capable of transmitting light 21a (ultraviolet light) for curing the imprint material 20 and includes a pattern region 11a in which a pattern (pattern with concave and convex portions) that should be transferred to the imprint material 20 on the substrate is formed. The substrate 13 is, for example, a single-crystal silicon substrate or an SOI (Silicon On Insulator) substrate. The imprint material 20 is supplied (applied) onto the upper surface (surface to be processed) of the substrate 13.

The mold holding unit 12 can include, for example, a mold chuck which chucks the mold 11 by a vacuum chuck force, an electrostatic chuck force, or the like, a mold stage on which the mold chuck is placed, and a driving system which drives (moves) the mold stage. The driving system of the mold holding unit 12 drives the mold stage (that is, the mold 11) at least in the Z direction (a pressing direction obtained when the mold 11 is pressed against the imprint material 20 on the substrate). The mold holding unit 12 has an opening 12a for making the light 21a emitted from the curing unit 21 and curing the imprint material 20 pass. Note that the driving system of the mold holding unit 12 in the first embodiment may have a function of driving the mold stage not only in the Z direction but also in, for example, the X direction, the Y direction, and the θ direction (rotational direction around the Z-axis).

The substrate holding unit 14 can include, for example, a substrate chuck which chucks the substrate 13 by a vacuum chuck force, an electrostatic chuck force, or the like, a substrate stage on which the substrate chuck is placed, and a driving system which drives (moves) the substrate stage. The driving system of the substrate holding unit 14 drives the substrate stage (that is, the substrate 13) at least in the X direction and the Y direction (directions perpendicular to the pressing direction of the mold 11). Note that the driving system of the substrate holding unit 14 in the first embodiment may have a function of driving the substrate stage not only in the X direction and the Y direction but also in, for example, the Z direction and the θ direction.

Each detection unit 15 includes a scope which optically detects (observes) marks 18 formed on the mold 11 (the mold-side marks 18 hereinafter) and marks 19 formed on the substrate 13 (the substrate-side marks 19 hereinafter). Then, each detection unit 15 obtains the relative positions of the mold 11 and the substrate 13 based on a result of a detection by the scope. Note that each detection unit 15 suffices to detect the relative positional relationship between the mold-side marks 18 and the substrate-side marks 19. Hence, each detection unit 15 may include a scope including an optical system for sensing an image of the two marks simultaneously, or a scope which detects a signal reflecting a relative positional relationship, such as an interference signal of the two marks or moiré. Each detection unit 15 may not simultaneously detect the mold-side marks 18 and substrate-side marks 19. For example, each detection unit 15 may detect the relative positional relationship between the mold-side marks 18 and the substrate-side marks 19 by obtaining the respective positions of the mold-side marks 18 and the substrate-side marks 19 with respect to a reference position arranged inside.

The curing unit 21 irradiates the imprint material 20 on the substrate with the light 21a (ultraviolet light) for curing the imprint material 20 via the mold 11 and the opening 12a of the mold holding unit 12, and cures the imprint material 20. The curing unit 21 can include, for example, a light source which emits the light 21a for curing the imprint material 20 and an optical system configured to adjust the light 21a emitted from the light source into optimal light in the imprint process. The imprint apparatus 1 of this embodiment can be configured such that the light 21a emitted from the curing unit 21 is reflected by a beam splitter 27 and irradiates the substrate 13 (imprint material 20).

The observation unit 23 includes a camera having a field of view within which the entire pattern region 11a of the mold 11 falls and has a function of observing (confirming) a cured state of the imprint material 20 on the substrate by irradiation with the light 21a. The observation unit 23 can also observe a mixed state of a foreign particle between the mold 11 and the substrate 13, a filled state of the pattern region 11a of the mold 11 with the imprint material 20, and a released state of the mold 11 from the cured imprint material 20 on the substrate. The observation unit 23 can further observe a contact state between the mold 11 and the imprint material 20 supplied onto the substrate. The imprint apparatus 1 of this embodiment is configured such that the observation unit 23 observes the cured state of the imprint material 20 via the beam splitter 27.

The control unit 26 includes, for example, a CPU and a memory, and controls the imprint process (controls the respective units of the imprint apparatus 1). In this embodiment, the control unit 26 controls, based on the detection result (that is, a measurement result of the relative positions of the mold 11 and the substrate 13) by each detection unit 15, the imprint process while aligning the mold 11 and the substrate 13 with each other. Based on an image obtained by the image sensing unit 24 to be described later, the control unit 26 obtains information on forming of the pattern of the imprint material 20 (information on molding of the imprint material 20). The information can contain, for example, at least one of information on mixture of the foreign particle between the mold 11 and the substrate 13, information on filling of a pattern of the mold 11 with the imprint material 20, and information on the overlay accuracy between the mold 11 and the substrate 13.

Figure 11:
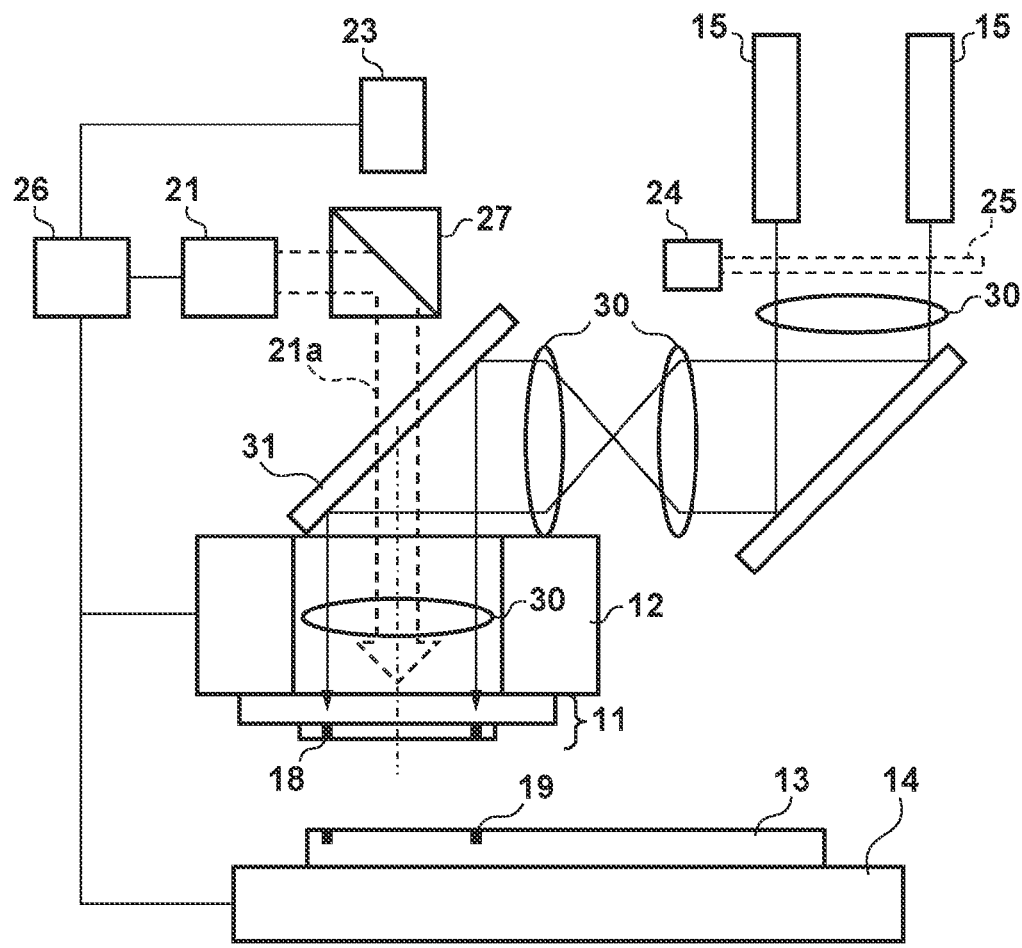
FIG. 11 is a schematic view showing the imprint apparatus including a relay optical system.

Since a space in the mold holding unit 12 is limited, it may be difficult to form various optical members and detection units. In particular, the detection units 15 need to be driven in accordance with mark positions, and thus additional spaces to form those driving mechanisms are needed. To cope with this, an optical system (relay optical system) configured to form an image of an observation region (images of the marks 18 and 19) in a space where the component is formed easily may be formed, as shown in FIG. 11. The relay optical system includes a plurality of relay lenses 30.

Each relay lens 30 forms, outside the mold holding unit 12, an image as an image obtained by unity magnifying or scaling the image of the observation region. Each relay lens 30 can be formed fixedly, and thus only the optical member such as a lens and a member holding it can be formed.

An imprint apparatus shown in FIG. 11 includes an optical member 31 configured to combine detection light detected by the detection units 15 with the light 21a or detection light for the observation unit 23, or separate the detection light detected by the detection units 15 from the light 21a or the detection light for the observation unit 23. For example, the optical member 31 may form an optical film having properties of reflection and transmission depending on a wavelength range. FIG. 11 shows an arrangement in which light of the wavelength range used by the detection units 15 is reflected, and the light 21a or light of the wavelength range used by the observation unit 23 is transmitted.

[Mold-Side Mark and Substrate-Side Mark]

The mold-side marks 18 and the substrate-side marks 19 used for alignment between the mold 11 and the substrate 13 will now be described with reference to FIGS. 2A and 2B. In FIGS. 2A and 2B, in a region (to be referred to as a shot region 13a hereinafter) on the substrate to which the pattern of the mold 11 should be transferred by one imprint process, six chip regions 13a are arranged.

FIG. 2A is a view showing the pattern region 11a of the mold 11, and more specifically, marks 18a to 18h provided at the four corners of the pattern region 11a. In FIG. 2A, the marks 18a, 18b, 18f, and 18e setting the X direction as the longitudinal direction are marks setting the X direction as a measurement direction, and the marks 18c, 18d, 18g, and 18h setting the Y direction as the longitudinal direction are marks setting the Y direction as a measurement direction. FIG. 2A also shows a region 11b in which a pattern that should be transferred to each of six chip regions 13b on the substrate is formed.

FIG. 2B is a view showing marks 19a to 19h provided in one shot region 13a of the substrate 13. In FIG. 2B, the marks 19a, 19b, 19f, and 19e setting the X direction as the longitudinal direction are marks setting the X direction as a measurement direction, and the marks 19c, 19d, 19g, and 19h setting the Y direction as the longitudinal direction are marks setting the Y direction as a measurement direction. FIG. 2B also shows the six chip regions 13b.

When the mold 11 and the imprint material 20 on the substrate are brought into contact with each other, the detection units 15 detect the relative positions of the respective marks 18a to 18h on the mold side and the corresponding respective marks 19a to 19h on the substrate side. Then, based on the result of the detection by each detection unit 15, the shape or the position of at least one of the pattern region 11a of the mold 11 and the shot region 13a of the substrate 13 is changed so that the respective relative positions become target relative positions. This makes it possible to accurately overlay the pattern region 11a of the mold 11 and the shot region 13a of the substrate 13.

[Imprint Process]

The imprint process of molding the imprint material 20 on the substrate by using the mold 11 will now be described with reference to FIGS. 3A to 3C. FIGS. 3A to 3C are views for explaining the imprint process.

First, as shown in FIG. 3A, the imprint material 20 is supplied to a target shot region (a shot region of a target for performing an imprint process from now on) on the substrate by the time pressing of the mold 11 is started. Since the imprint material 20 generally used in the imprint apparatus is highly volatile, the imprint material 20 is preferably supplied onto the substrate immediately before performing the imprint process. When the low volatile imprint material 20 is used, however, the imprint material 20 may be supplied onto the substrate in advance by a spin coater or the like. After the imprint material 20 is supplied onto the substrate, the detection units 15 detect the relative positions of the mold-side marks 18 and the substrate-side marks 19, and alignment between the mold 11 and the substrate 13 is performed based on the detection results, as described above.

After alignment between the mold 11 and the substrate 13 is performed, the mold 11 and the imprint material 20 on the substrate are brought into contact with each other, and the pattern of the mold 11 is filled with the imprint material 20 with the lapse of a predetermined time in that state, as shown in FIG. 3B. In this time, it is also preferable that the detection units 15 detect the mold-side marks 18 and the substrate-side marks 19, and alignment between the mold 11 and the substrate 13 is performed based on the detection results. Note that when a difference of refractive index is small between the mold 11 and the imprint material 20, it may become difficult for the detection units 15 to detect the mold-side marks 18 if the mold-side marks 18 are formed by a structure with concave and convex portions alone. It is therefore preferable that a substance different in refractive index or transmittance from the mold 11 is applied to the mold-side marks 18, or the refractive index of each mold-side mark 18 is changed by ion irradiation or the like. This allows the detection units 15 to detect the mold-side marks 18 even in the state in which the mold 11 and the imprint material 20 on the substrate are in contact with each other. After the lapse of the predetermined time for filling the pattern of the mold 11 with the imprint material 20, the curing unit 21 irradiates the imprint material 20 on the substrate with the light 21a via the mold 11 and cures the imprint material 20.

After the imprint material 20 on the substrate is cured, the mold 11 is separated (released) from the cured imprint material 20 on the substrate, as shown in FIG. 3C. This makes it possible to form the pattern in the imprint material 20 on the substrate (that is, this makes it possible to transfer the pattern of the mold 11 onto the substrate).

[Detection of Problem in Imprint Process]

In the imprint apparatus 1, a problem that, in the imprint process, the foreign particle mixes between the mold 11 and the substrate 13, the pattern with the concave and convex portions of the mold 11 is not sufficiently filled with the imprint material, or the like may arise. Such a problem may be taken over the following imprint process, and thus is preferably detected before the following imprint process. In the conventional imprint apparatus, the observation unit 23 observes (senses an image of) the state of the imprint material 20 on the substrate, and the problem is detected based on that observation result. Note that the state of the imprint material 20 on the substrate can include at least one of, for example, the cured state of the imprint material 20 on the substrate, the mixed state of the foreign particle between the mold 11 and the substrate 13, and the filled state of the pattern of the mold 11 with the imprint material 20. In addition to the above-described states, the state of the imprint material 20 may also include the contact state (pressing step) between the mold 11 and the imprint material 20 on the substrate, the released state of the mold from the cured imprint material 20, and the like.

In the imprint apparatus, the dimension of the shot region to which the pattern of the mold 11 is transferred in one imprint process is preferably made larger in order to increase productivity. If the dimension of the shot region is made larger, however, it may become difficult for the observation unit 23 having the field of view within which the entire pattern region 11a of the mold 11 falls to observe the state of the imprint material 20 (that is, to sense the image of the imprint material 20) at a sufficient resolution. That is, in the conventional imprint apparatus, it may become difficult to accurately detect the problem in the imprint process. The observation unit 23 having the field of view within which the entire pattern region 11a of the mold 11 falls can sense the image of the imprint material 20 on the substrate in contact with the mold 11 obliquely in the peripheral portion of the pattern region 11a. In this case, the image of the imprint material 20 which fills a plurality of concave portions in the pattern with the concave and convex portions of the mold 11 may be sensed in an overlapped state, resulting in an insufficient detection accuracy of the problem in the imprint process.

To cope with this, the imprint apparatus 1 of the first embodiment includes the image sensing unit 24 having a plurality of image sensors 24f arrayed in a line in the first direction (for example, the Y direction) and a scanning unit 25 which scans the image sensing unit 24 in the second direction (for example, the X direction) different from the first direction. The image sensing unit 24 and the scanning unit 25 can be provided inside the opening 12a of the mold holding unit 12. In the imprint process, the control unit 26 causes the image sensing unit 24 to sense the image of the imprint material 20 on the substrate while scanning the image sensing unit 24 in the second direction by the scanning unit 25 in the state in which the mold 11 and the imprint material 20 are in contact with each other. This allows the control unit 26 to obtain, based on the image obtained by the image sensing unit 24, to obtain the information on molding of the imprint material 20. The information can contain, for example, at least one of the information on mixture of the foreign particle between the mold 11 and the substrate 13, the information on filling of the pattern of the mold 11 with the imprint material 20, and information on an overlay accuracy between the mold 11 and the substrate 13. The image sensing unit 24 may sense the image of the imprint material 20 on the substrate via the optical member such as the beam splitter 27 or the relay lens 30. The imaging plane of the substrate 13 may be formed in the upper portion of the mold holding unit 12, and the image sensing unit 24 may sense an image of this.

[Arrangement of Image Sensing Unit 24]

Figure 4:
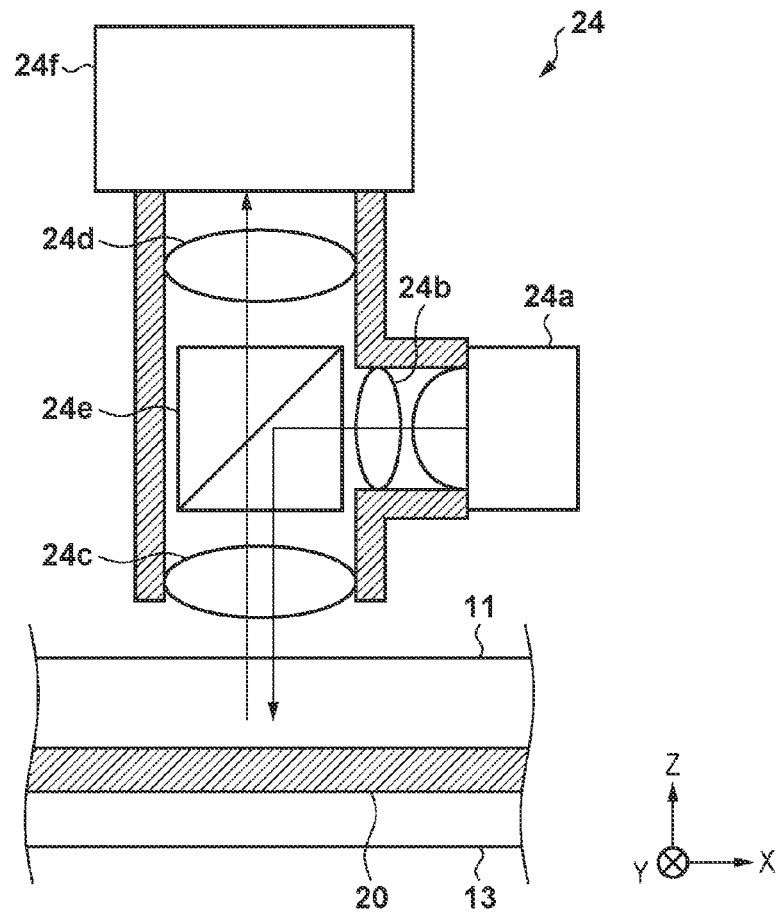
FIG. 4 is a schematic view showing an example of the arrangement of an image sensing unit.

The arrangement of the image sensing unit 24 will now be described with reference to FIG. 4. FIG. 4 is a schematic view (X-Z sectional view) showing an example of the arrangement of the image sensing unit 24. The image sensing unit 24 is arranged by arraying a plurality of units shown in FIG. 4 in the Y direction. One unit includes, for example, a light source 24a, optical members 24b to 24d, a half mirror 24e, and the image sensor 24f (photoelectric conversion element). The light source 24a can emit light having a wavelength different from that of the light 21a (ultraviolet light) that cures the imprint material 20. The light emitted from the light source 24a and transmitted through the optical member 24b is reflected by the half mirror 24e and transmitted through the optical member 24c. Then, the light reflected by the imprint material 20 (substrate 13) via the mold 11 is transmitted through the optical member 24c, the half mirror 24e, and the optical member 24d and enters the image sensor 24f. This allows the image sensing unit 24 to sense the image of the imprint material 20 (substrate 13).

Figure 5A:
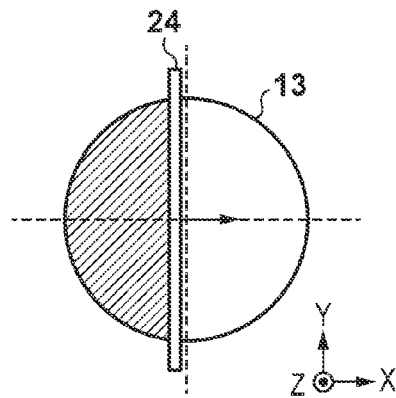
FIG. 5A is a view showing an example of scanning the image sensing unit.
Figure 5B:
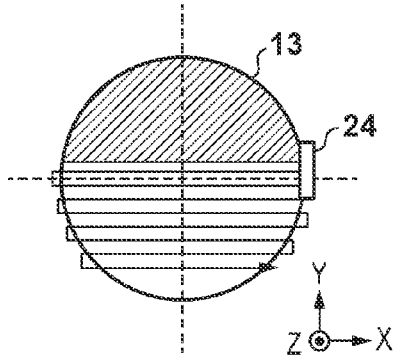
FIG. 5B is a view showing an example of scanning the image sensing unit.

Note that the image sensing unit 24 is preferably configured such that its length in the longitudinal direction (for example, the Y direction) in an imaging region is larger than the width of the pattern region 11a of the mold 11. The image sensing unit 24 thus configured can sense an image of the entire imprint material 20 in contact with the pattern region 11a of the mold 11 by being scanned once in the second direction (X direction) with the scanning unit 25. However, the present invention is not limited to this. For example, as shown in FIG. 5A, the image sensing unit 24 may be configured to be able to sense an image of the entire substrate 13 by being scanned only once in the second direction. As shown in FIG. 5B, the image sensing unit 24 may also be configured to be able to sense an image of the entire shot region (the entire substrate 13) by being scanned a plurality of times in the second direction.

[Image Sensing by Image Sensing Unit 24]

Image sensing of the imprint material 20 (substrate 13) by the image sensing unit 24 will now be described with reference to FIGS. 6A to 6D. Each of FIGS. 6A to 6D shows views for explaining image sensing of the imprint material 20 by the image sensing unit 24 and shows an example in which the pattern of the mold 11 is transferred to the entire substrate 13 by one imprint process. In each of FIGS. 6A to 6D, the upper view is a view obtained when the imprint apparatus 1 is viewed from the side (−Y-direction side), and the lower view is a view obtained when the imprint apparatus 1 is viewed from the upper side (Z-direction side). In each of FIGS. 6A to 6D, the control unit 26 is omitted, and the arrangement of the mold holding unit 12 is simplified for the sake of illustrative convenience.

Note that the image sensing unit 24 is arranged so as to pass between the mold 11 and the detection units 15 in scanning in the second direction (for example, the X direction), as shown in each of FIGS. 6A to 6D. For example, the scanning unit 25 includes an actuator such as a linear motor and scans (drives) the image sensing unit 24 along a guide rail 25a extending in the second direction. Further, the imprint material 20 is cured, and then measurement may be performed by scanning the image sensing unit 24 after the detection units 15 are retracted.

Figure 6C:
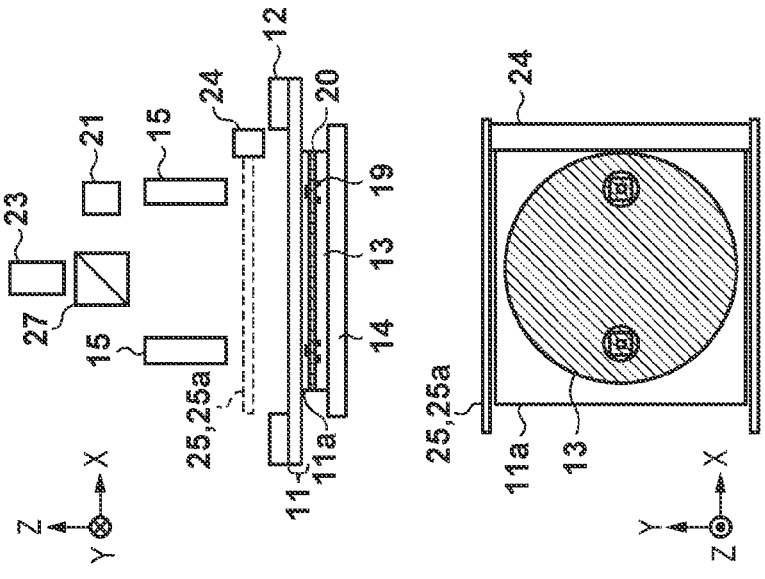
FIG. 6C shows views for explaining image sensing of the imprint material by the image sensing unit.
Figure 6D:
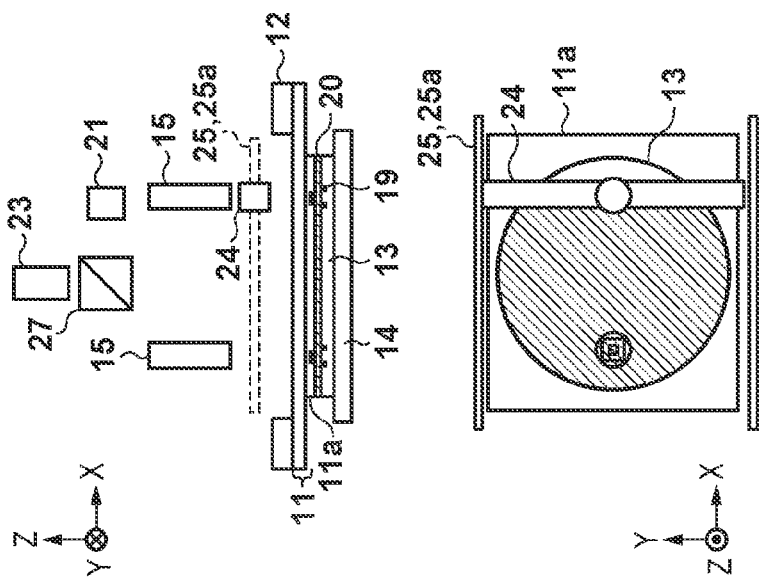
FIG. 6D shows views for explaining image sensing of the imprint material by the image sensing unit.

First, the control unit 26 causes the curing unit 21 to irradiate the imprint material 20 on the substrate with light via the mold 11 and cure the imprint material 20 in the state in which the mold 11 and the imprint material 20 on the substrate are in contact with each other, as shown in FIG. 6A. After the imprint material 20 is cured, the control unit 26 causes the image sensing unit 24 to sense an image of the cured imprint material 20 while scanning the image sensing unit 24 in the X direction by the scanning unit 25, as shown in FIGS. 6B and 6C. Each hatched portion in FIGS. 6B to 6D represents a region where the image sensing unit 24 finishes sensing the image of the imprint material 20. Then, the control unit 26 causes the scanning unit 25 to finish scanning the image sensing unit 24 after the image sensing unit 24 senses the image of the cured imprint material 20, as shown in FIG. 6D. As described above, by causing the image sensing unit 24 to sense the image of the imprint material 20 while scanning the image sensing unit 24, the control unit 26 can obtain, from the image sensing unit 24, the image of the imprint material 20 in contact with the mold 11 (pattern region 11a) and cured by the curing unit 21.

As described above, the imprint apparatus 1 of the first embodiment causes the image sensing unit 24 to sense the image of the imprint material 20 on the substrate in contact with the mold 11 while scanning, in the second direction, the image sensing unit 24 having the plurality of image sensors 24f arrayed in the first direction by the scanning unit 25. This makes it possible to increase a resolution when the image sensing unit 24 senses the image of the imprint material 20. It thus becomes possible to detect the problem in the imprint process accurately from the image obtained by the image sensing unit 24.

For the imprint apparatus in FIG. 11, the same effect can be obtained by arranging the image sensing unit 24 at the imaging position of the relay optical system (relay lens 30).

As described above, when it is difficult to arrange the image sensing unit 24 together with the driving mechanism in the limited space within the mold holding unit 12, it is preferable that the relay lens 30 forms the image of the observation region outside the mold holding unit 12, and the image sensing unit 24 observes that image.

Second Embodiment

Figure 7:
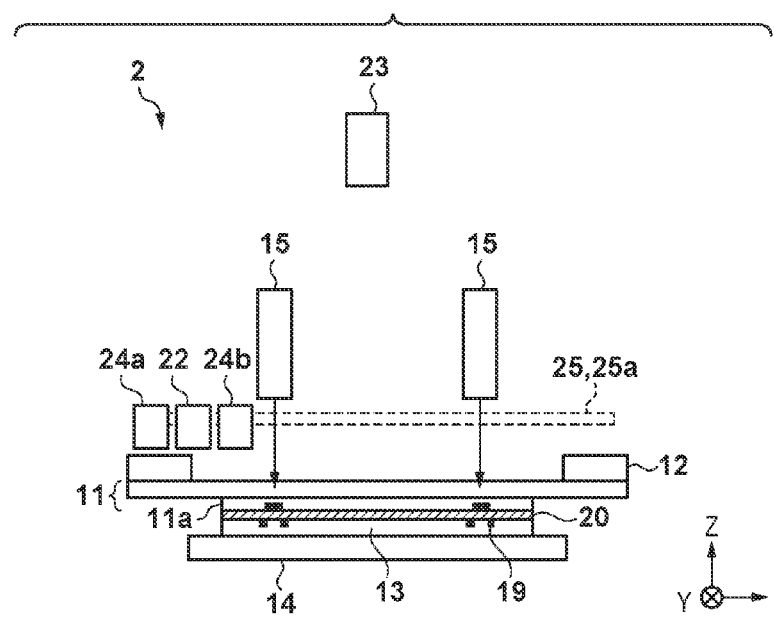
FIG. 7 is a schematic view showing an imprint apparatus according to the second embodiment.

An imprint apparatus 2 according to the second embodiment of the present invention will be described with reference to FIG. 7. FIG. 7 is a schematic view showing the imprint apparatus 2 according to the second embodiment. The imprint apparatus 2 of the second embodiment includes a curing unit 22 having a plurality of light sources 22a arrayed in a line in the first direction (for example, the Y direction). When an imprint material 20 on a substrate is cured, a scanning unit 25 scans the curing unit 22 in the scanning direction (the second direction (for example, the X direction)) of an image sensing unit 24. Thus configuring the curing unit 22 and the scanning unit 25 is advantageous in a case in which the imprint material 20 on the substrate is cured partially.

Figures 8A, 8B, 8C:
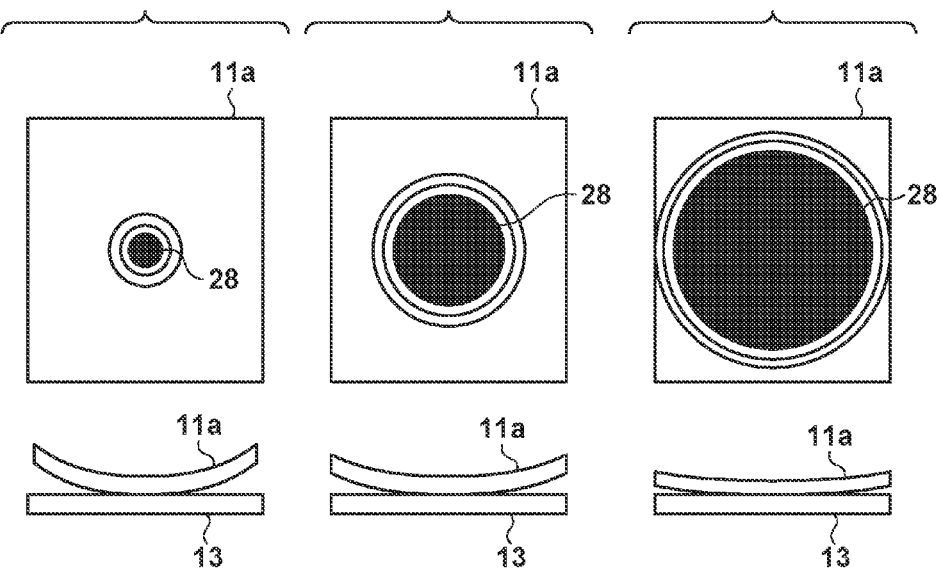
FIG. 8A shows views of a process of gradually extending the contact area between the imprint material and a mold deformed into a convex shape.
FIG. 8B shows views of the process of gradually extending the contact area between the imprint material and the mold deformed into the convex shape.
FIG. 8C shows views of the process of gradually extending the contact area between the imprint material and the mold deformed into the convex shape.

For example, in the imprint apparatus 2, a pattern region 11a of a mold may be deformed into a convex shape protruding toward a substrate 13 when a mold 11 and the imprint material 20 on the substrate are brought into contact with each other, as shown in each of FIGS. 8A to 8C. The contact area between the mold 11 and the imprint material 20 can gradually be extended (spread) from the center portion of the pattern region 11a by deforming the pattern region 11a of the mold 11 into the convex shape. This makes it possible to reduce bubbles remaining in a pattern of the mold 11. Each of FIGS. 8A to 8C shows a process of gradually extending (spreading) the contact area between the mold 11 and the imprint material 20. In each of FIGS. 8A to 8C, the upper view is a view obtained when the mold 11 and the substrate 13 are viewed from the upper side (Z-direction side), and the lower view is a view obtained when the mold 11 and the substrate 13 are viewed from the side (−Y-direction side). Each black circle represents a portion (contact portion 28) where the mold 11 and the imprint material 20 contact each other. Concentric lines in the outer periphery of each black region represent interference fringes by the mold and the substrate. When the contact area between the mold 11 and the imprint material 20 is gradually extended (spread) as described above, it is preferable that the imprint material 20 is cured partially at each of a plurality of timings in that process in order to reduce a positional shift between the mold 11 and the substrate 13 caused in the process.

In the imprint apparatus 2 thus configured, a pressing force applied to the contact portion 28 between the mold 11 and the imprint material 20 (a force pressing the mold 11 against the imprint material 20) becomes larger as the contact area is extended (spread) gradually. Therefore, for example, if a foreign particle mixes in the contact portion 28 shown in FIG. 8A, a stress generated by the foreign particle on the mold 11 and the substrate 13 becomes greater as the contact area is extended gradually. This may damage the mold 11 and the substrate 13. It is therefore preferable that a problem (for example, the foreign particle) in the contact portion 28 is detected at an early stage.

Therefore, the imprint apparatus 2 of the second embodiment causes the curing unit 22 to cure the imprint material 20 while scanning the curing unit 22 by the scanning unit 25 at each of the plurality of timings in the process of extending (spreading) the contact area gradually. In addition, at each of the plurality of timings, the imprint apparatus 2 causes the image sensing unit 24 to sense an image of the imprint material 20 cured by the curing unit 22 while scanning the image sensing unit 24 by the scanning unit 25. Note that the image sensing unit 24 in this embodiment includes a first image sensing unit 24a and a second image sensing unit 24b each having a plurality of image sensors 24f arrayed in a line in the first direction (Y direction). The first image sensing unit 24a and the second image sensing unit 24b are arranged so as to sandwich the curing unit 22 in the second direction (X direction). By thus arranging the image sensing unit 24, either the first image sensing unit 24a or the second image sensing unit 24b can sense the image of the imprint material 20 cured by the curing unit 22 even when the curing unit 22 and the image sensing unit 24 are scanned reciprocally. The scanning unit 25 in this embodiment uses a guide rail 25a in common when scanning the image sensing unit 24 and when scanning the curing unit 22.

Figure 9A:
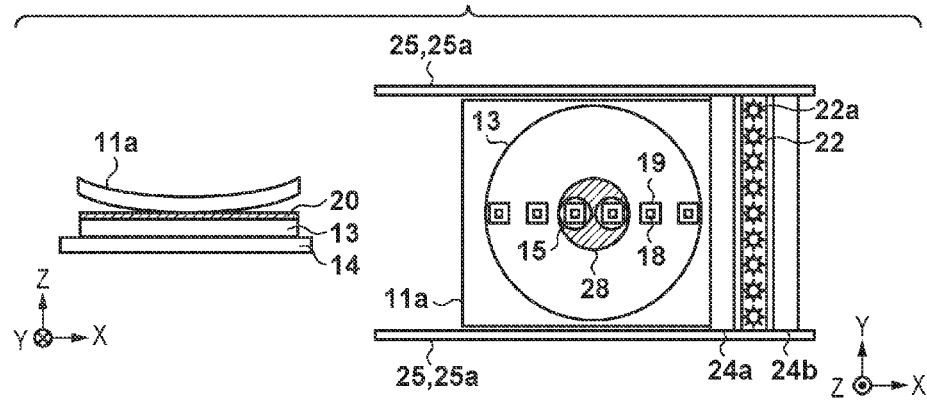
FIG. 9A shows views for explaining image sensing of the imprint material by an image sensing unit.
Figure 9B:
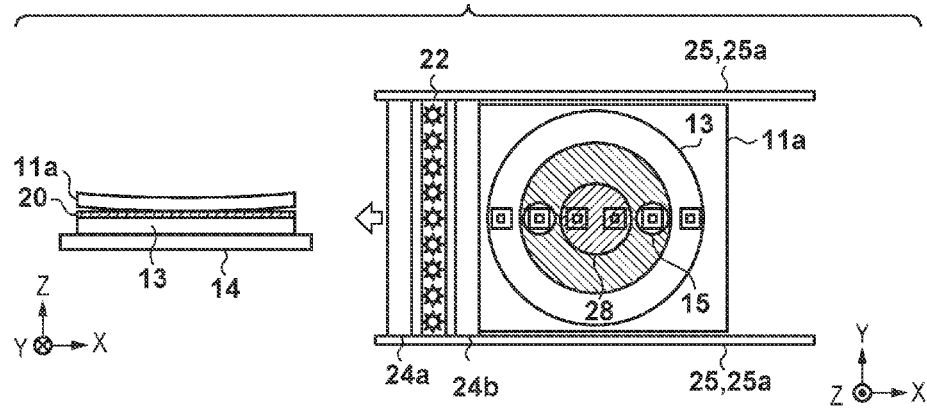
FIG. 9B shows views for explaining image sensing of the imprint material by the image sensing unit.
Figure 9C:
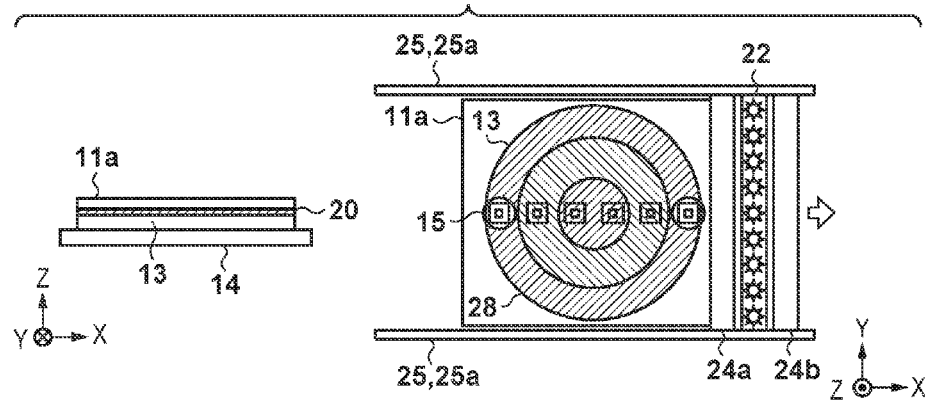
FIG. 9C shows views for explaining image sensing of the imprint material by the image sensing unit.

Image sensing of the imprint material 20 in the imprint apparatus 2 of the second embodiment will be described with reference to FIGS. 9A to 9C. FIGS. 9A to 9C are views for explaining image sensing of the imprint material 20 by the image sensing unit 24. In each of FIGS. 9A to 9C, the left view is a view obtained when the pattern region 11a of the mold 11 and the substrate 13 are viewed from the side (−Y-direction side), and the right view is a view obtained when the pattern region 11a of the mold 11 and the substrate 13 are viewed from the upper side (Z-direction side). In each of FIGS. 9A to 9C, a hatched portion of the right view corresponds to the contact portion 28 between the mold 11 and the imprint material 20. Note that detection units 15 in the imprint apparatus 2 of the second embodiment can movably be configured.

First, a control unit 26 causes the detection units 15 to detect mold-side marks 18 and substrate-side marks 19 in the contact portion 28 between the mold 11 and the imprint material 20 at the first timing in the process of extending (spreading) the contact area gradually. Then, alignment between the mold 11 and the substrate 13 is performed based on detection results by the detection units 15. After the alignment is performed, the control unit 26 causes the curing unit 22 to cure the imprint material 20 in the contact portion 28 and causes the first image sensing unit 24a to sense an image of the substrate 13 while scanning the curing unit 22 and the image sensing unit 24 in the +X direction by the scanning unit 25, as shown in FIG. 9A. At this time, the curing unit 22 can cure the imprint material 20 by using only the light source 22a corresponding to the contact portion 28 out of the plurality of light sources 22a. Note that the control unit 26 preferably controls the scanning unit 25 so as to scan the image sensing unit 24 (the first image sensing unit 24a at the first timing) followed by scanning the curing unit 22 when the scanning unit 25 scans the curing unit 22 and the image sensing unit 24. For example, the control unit 26 preferably controls the scanning unit 25 so as to keep a spacing between the curing unit 22 and the image sensing unit 24 constant when scanning the curing unit 22 and the image sensing unit 24.

Next, the control unit 26 causes the detection units 15 to detect the mold-side marks 18 and the substrate-side marks 19 in the contact portion 28 between the mold 11 and the imprint material 20 at the second timing when the contact area is further extended. Then, alignment between the mold 11 and the substrate 13 is performed based on detection results by the detection units 15. After the alignment is performed, the control unit 26 causes the curing unit 22 to cure the imprint material 20 in the contact portion 28 and causes the second image sensing unit 24b to sense an image of the substrate 13 while scanning the curing unit 22 and the image sensing unit 24 in the −X direction by the scanning unit 25, as shown in FIG. 9B.

Further, the control unit 26 causes the detection units 15 to detect the mold-side marks 18 and the substrate-side marks 19 in the contact portion 28 between the mold 11 and the imprint material 20 at the third timing when the contact area is still further extended. Then, alignment between the mold 11 and the substrate 13 is performed based on detection results by the detection units 15. After the alignment is performed, the control unit 26 causes the curing unit 22 to cure the imprint material 20 in the contact portion 28 and causes the first image sensing unit 24a to sense the image of the substrate 13 while scanning the curing unit 22 and the image sensing unit 24 in the +X direction by the scanning unit 25, as shown in FIG. 9C.

By thus performing the imprint process, the imprint apparatus 2 of the second embodiment can reduce the positional shift between the mold 11 and the substrate 13 caused in the process of gradually extending the contact area between the mold 11 and the imprint material 20. In addition, the imprint apparatus 2 can also detect the problem (for example, the foreign particle) in the contact portion 28 at the early stage.

In the second embodiment, the example has been described in which the curing unit 22 and the image sensing unit 24 are scanned so as to keep the spacing between the curing unit 22 and the image sensing unit 24 constant. However, the present invention is not limited to this. For example, the imprint material 20 in the contact portion 28 may be cured while scanning the curing unit by the scanning unit 25, and scanning of the image sensing unit 24 may be started after scanning of the curing unit 22 is completed.

Further, in the second embodiment, the curing unit 22 cures the imprint material 20, and the image sensing unit 24 senses the image of the imprint material 20 at each of the plurality of timings in the process of extending the contact area gradually. However, the present invention is not limited to this. For example, curing by the curing unit 22 and image sensing by the image sensing unit 24 may be performed after a step of bringing the mold 11 and the imprint material 20 into contact with each other is completed, that is, after the imprint material 20 and the entire pattern region 11a of the mold 11 are brought into contact with each other. As described above, only image sensing may be performed each time the contact area is extended stepwise, and curing may be performed after a transfer region contacts the contact area completely. Furthermore, in the second embodiment, the example has been described in which the pattern region 11a of the mold 11 is deformed into the convex shape. However, the substrate 13 may be deformed into the convex shape toward the mold 11.

Third Embodiment

Figure 10A:
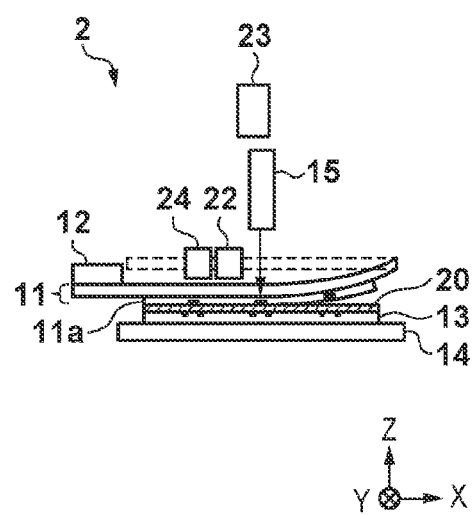
FIG. 10A is a view for explaining image sensing of the imprint material by the image sensing unit.
Figure 10B:
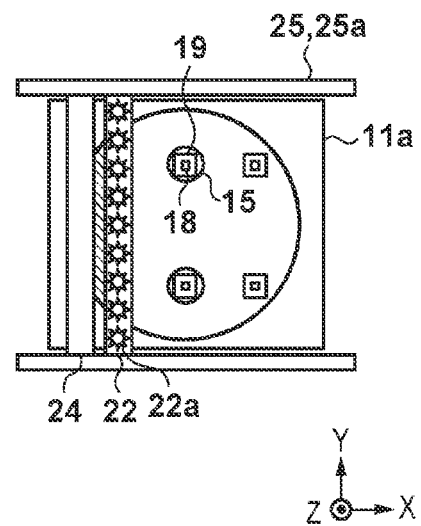
FIG. 10B is a view for explaining image sensing of the imprint material by the image sensing unit.

In the second embodiment, the example has been described in which the mold 11 and the imprint material 20 are gradually brought into contact with each other from the center portion of the pattern region 11a. However, the present invention is not limited to this. For example, as shown in FIGS. 10A and 10B, the present invention can also be applied to a case in which a mold 11 and an imprint material 20 are brought into contact with each other from the end portion of a pattern region 11a. FIGS. 10A and 10B are views for explaining image sensing of the imprint material 20 by an image sensing unit 24 in the case in which the mold 11 and the imprint material 20 are brought into contact with each other from the end portion of the pattern region 11a. FIG. 10A is the view obtained when an imprint apparatus 2 is viewed from the side (−Y-direction side). FIG. 10B is the view obtained when the imprint apparatus 2 is viewed from the upper side (Z-direction side).

As the mold 11 and the imprint material 20 are brought into contact with each other from the end portion of the pattern region 11a, a boundary between a contact portion and a non-contact portion (to be simply referred to as a "boundary" hereinafter) moves. A control unit 26 moves detection units 15 so as to follow the extension of the contact area (that is, movement of the boundary) between the mold 11 and the imprint material 20, and causes the detection units 15 to detect mold-side marks 18 and substrate-side marks 19 in the contact portion sequentially. Then, the control unit 26 performs alignment between the mold 11 and the substrate 13 based on detection results by the detection units 15. In order to follow the extension of the contact area (movement of the boundary), the control unit 26 causes a curing unit 22 to sequentially cure the imprint material 20 in the contact portion where the alignment is performed while scanning the curing unit 22 and the image sensing unit 24 by a scanning unit 25. In addition, the control unit 26 causes the image sensing unit 24 to sequentially sense an image of the imprint material 20 cured by the curing unit 22.

In the aforementioned embodiments, the arrangement has mainly been described in which pattern formation is performed at once on the entire surface of the substrate 13. However, the present invention is not limited to this.

FIG. 12 is a view for explaining a region where a pattern is formed on a substrate 13 by one imprint process. An A region shown in FIG. 12 indicates one shot region. One shot region indicates a region where a pattern is formed by, for example, a lithography apparatus different from the imprint apparatus. In order to increase productivity, a method of imprinting a plurality of shot regions simultaneously is proposed. As examples, FIG. 12 shows a B region where two shot regions are imprinted simultaneously and a C region where four shot regions are imprinted simultaneously.

As the number of regions to be imprinted simultaneously increases, an observation unit 23 has a wider range to observe and a lower pixel resolution. Therefore, if not a mode in which an entire wafer surface is imprinted at once, the same effect can also be obtained in imprinting the plurality of shot regions simultaneously.

<Embodiment of Method of Manufacturing Article>

A method of manufacturing an article according to an embodiment of the present invention is suitable for manufacturing an article, for example, a micro device such as a semiconductor device or an element having a microstructure. The method of manufacturing the article according to this embodiment includes a step of forming a pattern in an imprint material supplied onto a substrate using the above-described imprint apparatus and a step of processing the substrate, on which the pattern has been formed, in the preceding step. This manufacturing method further includes other known steps (oxidation, deposition, vapor deposition, doping, planarization, etching, resist separation, dicing, bonding, packaging, and the like). The method of manufacturing the article according to this embodiment is advantageous in at least one of the performance, the quality, the productivity, and the production cost of the article, as compared with a conventional method.

OTHER EMBODIMENTS

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2015-158495 filed on Aug. 10, 2015 and 2016-132779 filed on Jul. 4, 2016, which are hereby incorporated by reference herein in their entirety.

What is claimed is:

1. An imprint apparatus which forms a pattern of an imprint material on a substrate by using a mold, the apparatus comprising:
   an image sensing unit configured to sense an image of the imprint material via the mold; and
   a control unit configured to, in a state in which the mold and the imprint material are in contact with each other, cause the image sensing unit to sense the image of the imprint material while scanning the image sensing unit and obtain information on forming of the pattern of the imprint material based on the image obtained by the image sensing unit.

2. The apparatus according to claim 1, wherein at each of a plurality of timings in a process of extending a contact area between the mold and the imprint material, the control unit causes the image sensing unit to sense the image of the imprint material in contact with the mold while scanning the image sensing unit and obtains the information based on the image obtained by the image sensing unit.

3. The apparatus according to claim 1, wherein in a case in which a contact area between the mold and the imprint material is extended from an end portion of a pattern region of the mold, the control unit causes the image sensing unit to sense the image of the imprint material in contact with the mold while scanning the image sensing unit so as to follow an extension of the contact area and obtains the information based on the image obtained by the image sensing unit.

4. The apparatus according to claim 1, wherein a length of the image sensing unit in a longitudinal direction in an imaging region is larger than a width of a pattern region of the mold, and
   the control unit causes the image sensing unit to sense an image of the imprint material in contact with the pattern region while scanning the image sensing unit in a direction different from the longitudinal direction and obtains the information based on the image obtained by the image sensing unit.

5. The apparatus according to claim 1, further comprising a mold holding unit configured to hold the mold and having an opening for making light that cures the imprint material pass,
   wherein the image sensing unit is arranged inside the opening.

6. The apparatus according to claim 1, further comprising a curing unit configured to irradiate the imprint material with light via the mold and cure the imprint material,
   wherein the control unit causes the image sensing unit to sense an image of the imprint material in contact with the mold and cured by the curing unit while scanning the image sensing unit, and obtains the information based on the image obtained by the image sensing unit.

7. The apparatus according to claim 6, wherein the control unit causes the curing unit to cure the imprint material while scanning the curing unit in a scanning direction of the image sensing unit.

8. The apparatus according to claim 7, wherein the control unit scans the image sensing unit so as to follow scanning of the curing unit.

9. The apparatus according to claim 8, wherein the control unit scans the image sensing unit so as to keep a spacing between the image sensing unit and the curing unit constant.

10. The apparatus according to claim 7, wherein the image sensing unit includes a first image sensing unit and a second image sensing unit arranged so as to sandwich the curing unit in the scanning direction of the image sensing unit.

11. The apparatus according to claim 7, wherein the control unit scans the image sensing unit and the curing unit along a common guide rail.

12. The apparatus according to claim 1, further comprising a detection unit configured to detect a mark provided on the mold and a mark provided on the substrate,
   wherein the image sensing unit is scanned so as to pass between the mold and the detection unit.

13. The apparatus according to claim 1, further comprising an observation unit having a field of view within which an entire pattern region of the mold falls and configured to observe the substrate via the mold.

14. The apparatus according to claim 1, wherein the information contains at least one of information on mixture of a foreign particle between the mold and the substrate, information on filling of a pattern of the mold with the imprint material, and information on an overlay accuracy between the mold and the substrate.

15. A method of manufacturing an article, the method comprising:
- forming a pattern on a substrate using an imprint apparatus;
- processing the substrate, on which the pattern has been formed, to manufacture the article,
- wherein the imprint apparatus forms a pattern of an imprint material on the substrate by using a mold, and includes:
- an image sensing unit configured to sense an image of the imprint material via the mold; and
- a control unit configured to, in a state in which the mold and the imprint material are in contact with each other, cause the image sensing unit to sense the image of the imprint material while scanning the image sensing unit and obtain information on forming of the pattern of the imprint material based on the image obtained by the image sensing unit.

* * * * *